United States Patent
Yoon et al.

(10) Patent No.: US 7,807,542 B2
(45) Date of Patent: Oct. 5, 2010

(54) SEMICONDUCTOR DEVICE HAVING STORAGE NODE ELECTRODE WITH PROTECTION FILM THEREON AND METHOD OF FABRICATING THE SAME

(75) Inventors: Joo-Byoung Yoon, Gyeonggi-do (KR); Jin-Sung Kim, Gyeonggi-do (KR); Kyung-Woo Lee, Gyeonggi-do (KR); Yeong-Cheol Lee, Seoul (KR); Sang-Jun Park, Gyeonggi-do (KR); Hye-Sun Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 837 days.

(21) Appl. No.: 11/562,369

(22) Filed: Nov. 21, 2006

(65) Prior Publication Data

US 2007/0117333 A1    May 24, 2007

(30) Foreign Application Priority Data

Nov. 22, 2005    (KR) ...................... 10-2005-0111995

(51) Int. Cl.
*H01L 21/20* (2006.01)
(52) U.S. Cl. ................. 438/396; 438/397; 257/E21.648
(58) Field of Classification Search ......... 438/253–255, 438/296–298, 396–398; 257/303–306, 311, 257/E27.048, E21.396, E21.648
See application file for complete search history.

(56) References Cited

U.S. PATENT DOCUMENTS

| 6,180,481 | B1 | 1/2001 | Deboer et al. |
| 6,670,256 | B2 | 12/2003 | Yang et al. |
| 6,855,597 | B2 | 2/2005 | Shin et al. |
| 6,881,642 | B2 | 4/2005 | Basceri et al. |
| 7,033,884 | B2 | 4/2006 | Basceri et al. |
| 2004/0110341 | A1 * | 6/2004 | Park et al. .................... 438/253 |
| 2006/0024883 | A1 * | 2/2006 | Hwang ........................ 438/253 |

FOREIGN PATENT DOCUMENTS

| JP | 2005-064175 | 3/2005 |
| KR | 2004-0000602 | 1/2004 |
| KR | 2005-0062919 | 6/2005 |
| KR | 2005-0067564 | 7/2005 |

OTHER PUBLICATIONS

English language abstract for Korean Publication No. 2004-0000602.
English language abstract for Korean Publication No. 2005-0062919.
English language abstract for Korean Publication No. 2005-0067564.
English language abstract for Japanese Publication No. 2005-064175.

* cited by examiner

*Primary Examiner*—Brook Kebede
(74) *Attorney, Agent, or Firm*—Muir Patent Consulting, PLLC

(57) ABSTRACT

A highly reliable semiconductor device and a method fabricating the same are provided, the semiconductor device having a low resistance electrode structure. The semiconductor device includes an interlayer insulation film formed on a semiconductor substrate. A storage node electrode is formed on the interlayer insulation film. A protection film is formed on the storage node electrode and includes a nitrided metal film. A dielectric film overlies the protection film. A plate electrode is formed on the dielectric film.

33 Claims, 10 Drawing Sheets

SEMICONDUCTOR DEVICE HAVING STORAGE NODE ELECTRODE WITH PROTECTION FILM THEREON AND METHOD OF FABRICATING THE SAME

CROSS-REFERENCE TO RELATED APPLICATION

This application claims priority from Korean Patent Application No. 10-2005-0111995, filed on Nov. 22, 2005, the disclosure of which is incorporated herein in its entirety by reference.

BACKGROUND

1. Technical Field

Embodiments exemplarily described herein relate to a semiconductor device and a method of fabricating the same, and more particularly, to a semiconductor having a storage node electrode and a method of fabricating the same. The semiconductor device may comprise a DRAM having a capacitor structure.

2. Description of the Related Art

Semiconductor devices, for example, DRAMs, are highly integrated and have high capacitance. To increase the capacitance of a highly integrated DRAM, more capacitors are arranged in a limited area and capacitors with higher capacitance are used. Accordingly, the density and height of storage node electrodes in the capacitors have increased.

For example, a DRAM cell having a cylindrical storage electrode is disclosed in U.S. Pat. No. 6,855,597 issued to Shin Chul-Ho et al. In the DRAM cell, a dielectric film is formed on an outer surface as well as an inner surface of a storage node electrode. Accordingly, the area of the dielectric film and the capacitance of a capacitor are increased. The storage node electrode may be formed of a doped polysilicon. However, the capacitance of the capacitor may decrease due to depletion of a dopant in the polysilicon.

To address this problem, a metal film is used as the storage node electrode. For example, a metal nitride film, such as a titanium nitride film, is used as the storage node electrode. The metal nitride film is formed by a chemical vapor deposition (CVD) process rather than a physical vapor deposition (PVD) process due to step coverage. However, the metal nitride film formed by the CVD process has a columnar grain structure with low density.

Thus, the metal nitride film with the columnar structure may be susceptible to penetration of a wet chemical and oxygen. When the wet chemical penetrates into the metal nitride film and reaches a lower region of the metal nitride film, an insulation film and a contact plug that underlie the metal nitride film may be etched, thereby generating a void. The oxygen penetration into the metal nitride film may also oxidize the metal nitride film, thereby increasing a resistance of the metal nitride film. The generation of a void may significantly decrease the reliability of the DRAM, for example, causing a circuit disconnection.

FIG. 1 shows a void generated when a titanium nitride film is used as the storage node electrode. A titanium nitride film 80 is formed on a semiconductor substrate 60 by CVD to interpose an insulation film 70 therebetween. The titanium nitride film 80 has a columnar grain structure. Thereafter, a resultant substrate on which the titanium nitride film 80 is formed is treated with a wet chemical, for example, a diluted HF solution, for a predetermined time, and then its cross-section is observed by an electron microscope. A void generated due to etching of the insulation film 70 is observed in a region B under the titanium nitride film 80, as illustrated in FIG. 1. That is, the wet chemical penetrates below the storage node electrode that is formed of the titanium nitride film, and thus a void may be formed under the storage node electrode.

SUMMARY

Embodiments exemplarily described herein provide a high reliability semiconductor device having a low resistance electrode structure without a void therein. Embodiments exemplarily described herein also provide a method of fabricating a semiconductor device that can prevent generation of a void under a storage node electrode and a resistance increase of the storage node electrode.

In one embodiment, a semiconductor device comprises an interlayer insulation film formed on a semiconductor substrate, the interlayer insulation film including a contact plug; a storage node electrode electrically connected to the contact plug; a protection film formed on the storage node electrode, the protection film including a nitrided metal film; a dielectric film formed the protection film; and a plate electrode formed on the dielectric film.

BRIEF DESCRIPTION OF THE DRAWINGS

The above and other features and advantages of the embodiments described above will become more apparent by describing in detail exemplary embodiments thereof with reference to the attached drawings in which.

DETAILED DESCRIPTION OF EXAMPLE EMBODIMENTS

Figure 1:
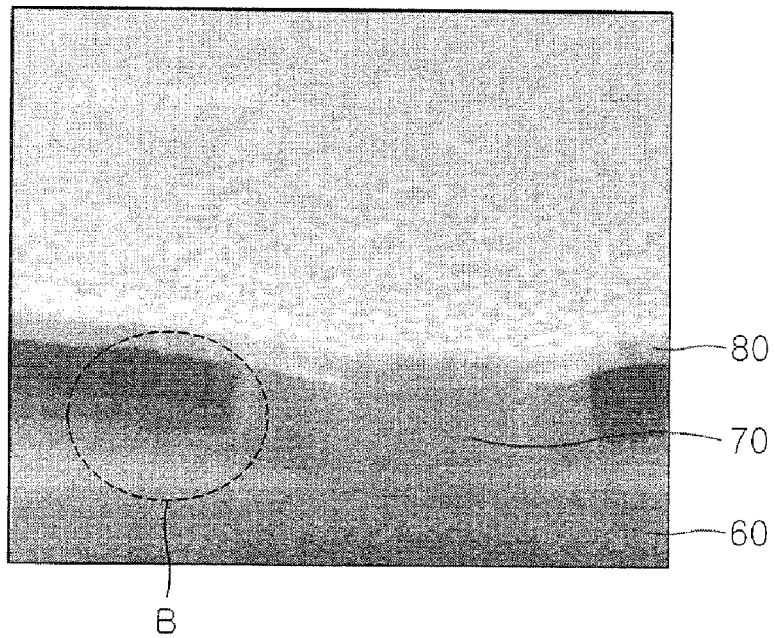
FIG. 1 is a scanning electron microscope photograph showing a section of a conventional semiconductor device where a void is generated.

Some embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the forms of elements may be exaggerated for clarity.

Structure

A semiconductor device according to some embodiments of the present invention includes a storage node electrode, a dielectric film, and a plate electrode. For example, the semiconductor device may be a DRAM having a capacitor structure, Referring to FIG. 9, a semiconductor device according to an embodiment of the present invention includes a storage node electrode 150, a dielectric film 165, and a plate electrode 170 on an interlayer insulation film 110. In the illustrated embodiment, the storage node electrode can be characterized as defining a shape having a generally concave inner surface and a generally convex outer surface. The interlayer insulation film 110 is formed on a semiconductor substrate 105, and may include a contact plug 115. At least a portion of the storage node electrode 150 is electrically connected to the contact plug 115. A protection film 155 is interposed between an inner surface of the storage node electrode 150 and the dielectric film 165.

The storage node electrode 150, the dielectric film 165, and the plate electrode 170 may form a capacitor structure. The semiconductor device may be, for example, a DRAM including the capacitor structure. The DRAM may further include a switching device (not shown) for controlling the capacitor structure. For example, a transistor (not shown) may be further formed as a switching device on the semiconductor substrate 105, and a source or a drain (not shown) of the transistor may be electrically connected to the storage node electrode 150 through the contact plug 115. The transistor structure may be the general structure known to those skilled in the art.

More specifically, the semiconductor substrate 105 may include a bulk wafer including silicon, germanium, or a compound of these elements, and further include an epitaxial layer of silicon, germanium, or a compound of these elements. A portion of the semiconductor substrate 105 may be connected to the contact plug 115.

The interlayer insulation film 110 may be formed to expose an upper surface of the contact plug 115. The number of the contact plug 115 may be selected properly, and is not intended to limit the scope of the present invention. An etch stop film 120 may be further formed on the interlayer insulation film 110. The etch stop film 120 may be formed to expose at least a portion of the upper surface of the contact plug 115. For example, the interlayer insulation film 110 may include silicon oxide, and the etch stop film 120 may include silicon nitride. The contact plug 115 may include a conductive material, for example, a doped polysilicon and a metal such as tungsten.

The storage node electrode 150 may be formed in the shape of a cylinder, and at least a portion thereof is connected to the contact plug 115. For example, the storage node electrode 150 may include a bottom 150a and a sidewall 150b, and at least a portion of the bottom 150a may be electrically connected to the contact plug 115. The sidewall 150b may extend from an end portion of the bottom 150a in an upward direction of the interlayer insulation film 110 (i.e., away from the interlayer insulation film 110). For example, the storage node electrode 150 has a cylinder shape having an inner space defined by the bottom 150a and the sidewall 150b.

Figure 9:
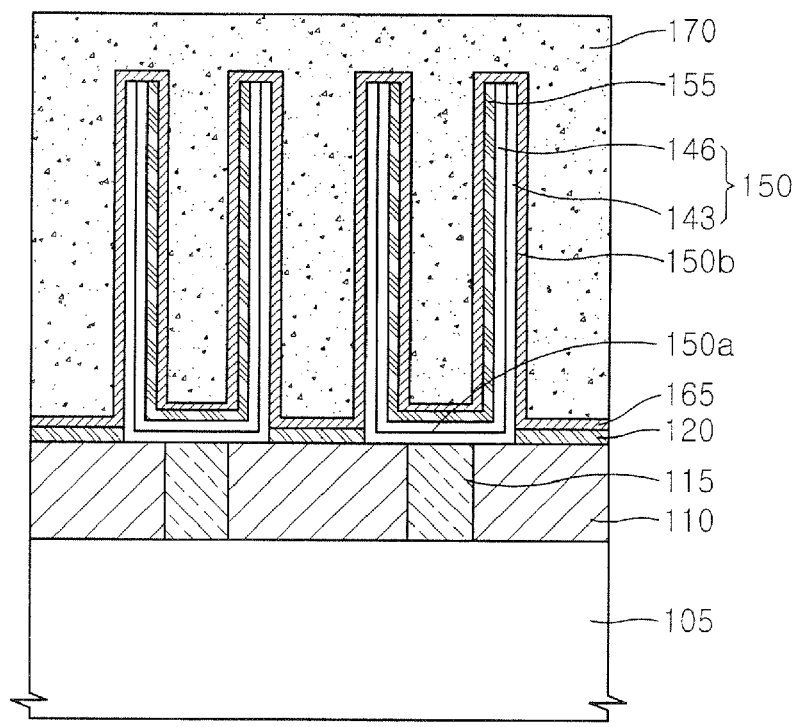

Although the sidewall 150b is formed vertically on the interlayer insulation film 110 in FIG. 9, other configurations of the sidewall 150b may be adopted. For example, the sidewall 150b may have a shape inclined on the interlayer insulation film 110 or a stairs-shape having a step height.

A lower end of the sidewall 150b may be surrounded by the etch stop film 120. The number of storage node electrodes 150 can be selected according to a capacity of the semiconductor device, and is not intended to limit the scope of the present invention. For example, a plurality of storage node electrodes 150 may be arranged in an array type.

The storage node electrode 150 may include a stack structure of a metal film 143 and a metal nitride film 146. For example, the metal film 143 may include a titanium (Ti) film, a tantalum (Ta) film or a tungsten (W) film, and the metal nitride 146 may include a titanium nitride (TiN) film, a tantalum nitride (TaN) film or a tungsten nitride (WN) film.

In another embodiment, the storage node electrode 150 may be formed of only the metal nitride film 146. In yet another embodiment, the storage node electrode 150 may include a nitrided metal film (not shown) below the metal nitride film 146. The nitrided metal film means that the metal film is nitrided after being formed. For example, the metal film 143 may be nitrided to form the nitrided metal film below the metal nitride film 146 to form the storage node electrode 150.

In the illustrated embodiment, the metal nitride film and the nitrided metal film are used separately from each other due to a method of forming them and a structural difference. For example, the metal nitride film is grown. Accordingly, the metal nitride film grown by a chemical vapor deposition (CVD) process may have a columnar grain structure with a strong preferred orientation. However, the metal film, for example, the titanium film, may not have a columnar grain structure or have a weak columnar grain structure when it is grown by the CVD. The nitrided metal film means that a metal film is grown and subsequently nitrided after being grown. The nitridation process means injecting nitrogen into the metal film. The preferred orientation of the metal film may be decreased, and the density of the metal film may be increased by the nitridation process. Therefore, the nitrided metal film can have a grain structure that is different (e.g., less columnar than) from the grain structure of the metal nitride film. In one embodiment, the nitrided metal film can have a grain structure that is essentially random, without the preferred orientation, and having a higher density than that, of the metal nitride film.

Features of the nitrided metal film, which has the random grain structure and the high density, are illustrated with reference to FIG. 17. According to this aspect, the nitrided metal film of the storage node electrode 150 can prevent an outer surface of the sidewall 150b from being etched by a wet chemical. Also, the nitrided metal film can prevent penetration of the wet chemical through the sidewall 150b.

The protection film 155 may be formed on the inner surface defined by the bottom 150a and the sidewall 150b of the storage node electrode 150. The protection film 155 includes at least one nitrided metal film. The nitrided metal film of the protection film 155 may be formed of the same material as the nitrided metal film of the storage node electrode 150. For example, the nitrided metal film may include a nitrided titanium film, a nitrided tantalum film or a nitrided tungsten film.

Furthermore, the protection film 155 may further include a metal oxynitride film or a metal oxide film or a stack film of these on the nitrided metal film. The nitrided metal film may be oxidized to form the metal oxynitride film and the metal oxide film. For example, when the nitrided metal film is the Ti(N) film, the metal oxynitride film may be a TiON film, and the metal oxide film may be a $TiO_2$. The metal oxynitride film or the metal oxide film may affect a quality of the dielectric film 165 as described below.

The nitrided metal film of the protection film 155 may prevent penetration of a wet chemical or oxygen through the bottom 150b. Accordingly, the interlayer insulation film 110 and the contact plug 115 can be prevented from being etched due to the wet chemicals that penetrated the bottom 150b, thereby preventing a void from being generated under the storage node electrode 150. In order to achieve this, a thickness of the protection film 155 may be in a range of approximately 50 Å to approximately 150 Å.

The dielectric film 165 is formed at least on the storage node electrode 150 where the protection film 155 is formed. For example, the dielectric film 165 may be formed as a single layer on the protection film 155, the sidewall 150b, and the etch stop film 120. For example, the dielectric film 165 may include a silicon oxide film, a silicon nitride film, a metal oxide film with a high dielectric constant, or a stack film of these. When the protection film 155 includes the metal oxide film thereon, the dielectric film 165 may be successively formed on the metal oxide film, and thus the dielectric film 165 may have high uniformity and low surface roughness.

The plate electrode 170 is formed on the dielectric film 165. For example, the plate electrode 170 may include a polysilicon film, a silicon-germanium (SiGe) film, a metal film, or a metal nitride film. When both the plate electrode 170 and the storage node electrode 150 are formed of a metal, the semiconductor device includes a metal-dielectric film-metal (MIM) capacitor structure.

Fabrication Method

A method of fabricating a semiconductor device according to some embodiments now will be described with reference to FIGS. 2 through 9.

Figure 2:
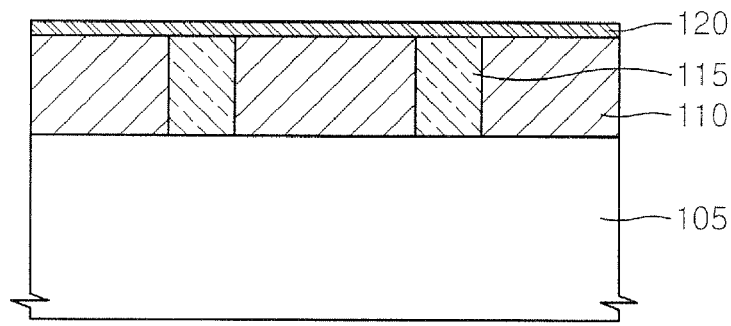
FIGS. 2 through 9 are cross-sectional views illustrating a semiconductor device and a method of fabricating the same according to an embodiment.

Referring FIG. 2, an interlayer insulation film 110 is formed on a semiconductor substrate 105. The interlayer insulation film 110 may include contact plugs 115 extending therethrough. An etch stop layer 120' is formed on the interlayer insulation film 110. The interlayer insulation film 110 may include silicon oxide, and the etch stop layer 120' may include silicon nitride. The contact plugs 115 may include a conductive material, for example, doped polysilicon, metal, metal silicide or a stack film of these.

It will be appreciated that another structure may be interposed in the semiconductor substrate 105 or between the semiconductor substrate 105 and the interlayer insulation film 110. For example, in the case of a DRAM, a switching device, for example, a plurality of transistors (not shown), may be formed on the semiconductor device 105.

Figure 3:
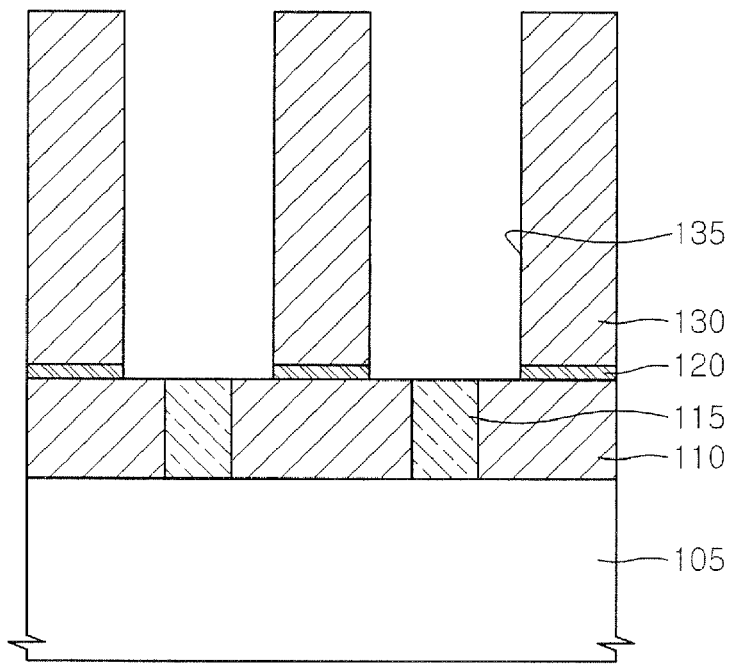

Referring to FIG. 3, a mold insulation film 130 including a storage node hole 135 is formed on the interlayer insulation film 110. More specifically, a mold insulation layer (not shown) is formed the etch stop layer (120' in FIG. 2). Next, a predetermined portion of the mold insulation layer and the etch stop layer 120' are removed, for example, by etching so that the storage node hole 135, which exposes at least a portion of an upper surface of the contact plug 115, can be formed. Also, an etch stop layer pattern 120 is formed during this process. The mold insulation film 130 formed on the etch stop layer pattern 120 may include a silicon oxide film.

Figure 4:
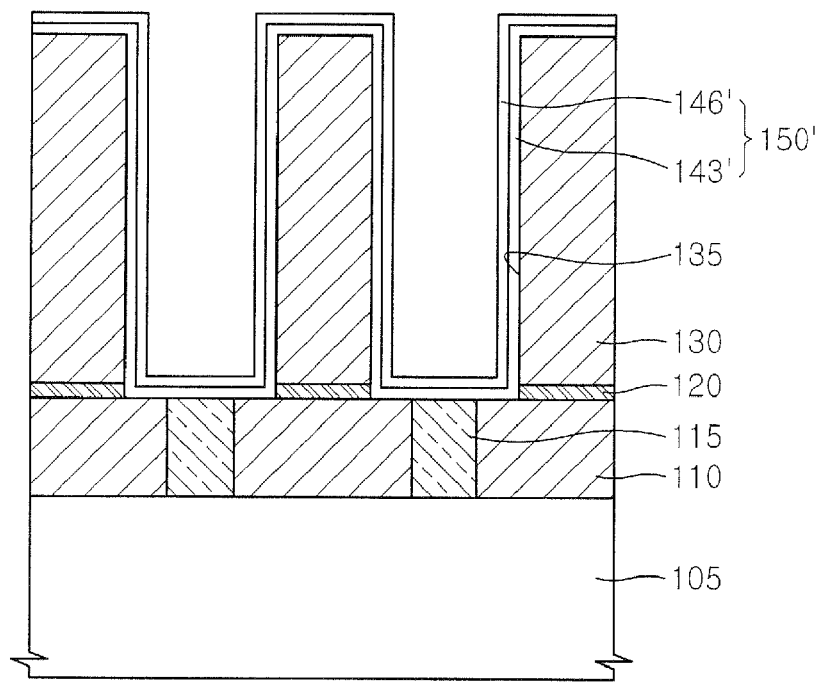

Referring to FIG. 4, a storage node electrode layer 150' is formed on a surface of a resultant substrate where the storage node hole 135 is formed. The storage node electrode layer 150' may include a stack structure of a metal layer 143' and a metal nitride layer 146'. For example, the metal layer 143' may include a Ti layer, a Ta layer or a W layer, and the metal nitride layer 146' may include a TiN layer, a TaN layer, or a WN layer. The storage node electrode layer 150' may be formed using a material film deposition process having excellent step coverage, for example, a CVD process.

In another embodiment, the metal layer 143' may be nitrided after deposition. The nitridation may be a process of injecting nitrogen into the metal layer 143'. This process may include a thermal treatment of the metal layer 143' in a nitrogen-containing atmosphere, for example, in a nitrogen or ammonia atmosphere. Accordingly, the nitrided metal layer may have high density and a random grain structure, but not a columnar structure. In another embodiment, the storage node electrode layer 150' may be essentially formed of only the metal nitride layer 146'.

Figure 5:
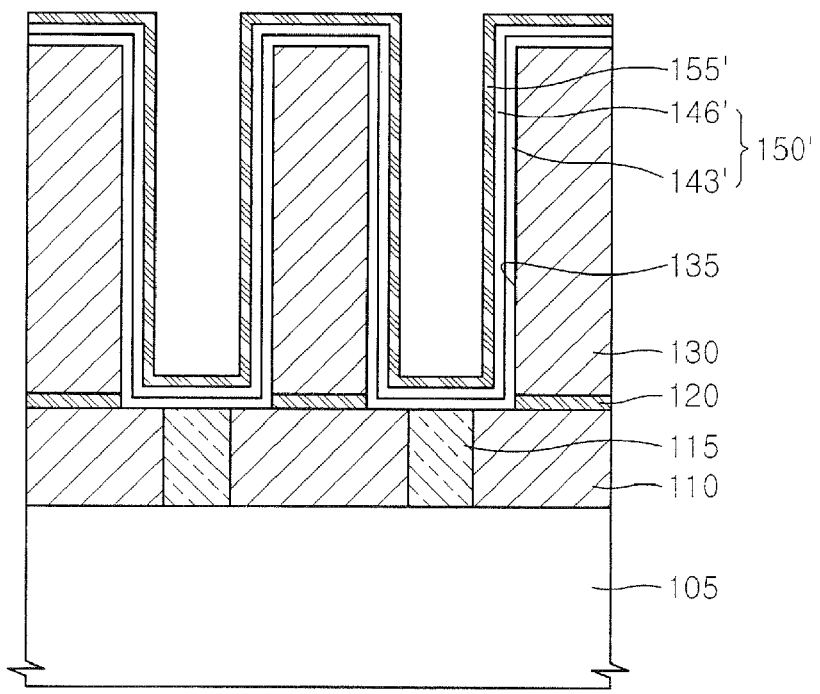

Referring to FIG. 5, the protection layer 155' including a nitrided metal layer is formed on the storage node electrode layer 150'. The nitrided metal layer may include a nitrided Ti layer, a nitrided Ta layer or a nitrided W layer. For example, the metal layer may be deposited using a conventional thin film deposition process having an excellent step coverage, for example, the CVD process, and the metal layer is then nitrided to form the protection layer 155'. More specifically, the deposition and the nitridation of the metal layer may be successively performed in-situ within the same CVD apparatus. The nitrided metal layer of the protection layer 155' may be substantially the same material as the nitrided metal layer of the storage node electrode layer 150'.

Figure 6:
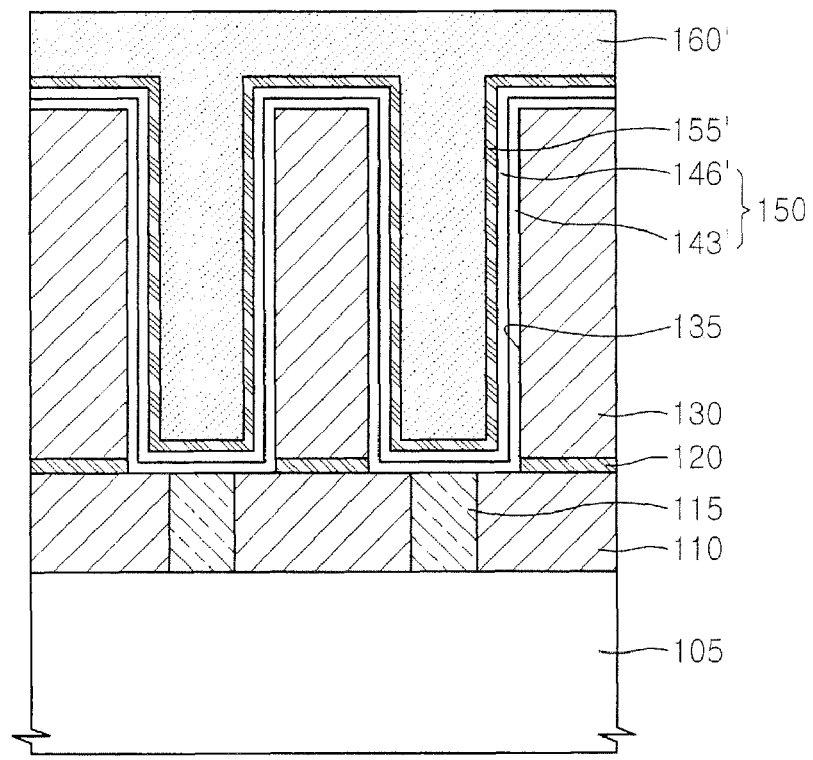

Referring to FIG. 6, a mask insulation layer 160' is formed on the protection layer 155'. For example, the mask insulation layer 160' may be formed to include a silicon oxide film and fill the storage node electrode hole 135. The mask insulation layer 160' may be formed using the CVD process or an atomic layer deposition (ALD) process. However, in a modified embodiment, the mask insulation layer 160' may be omitted.

Figure 7:
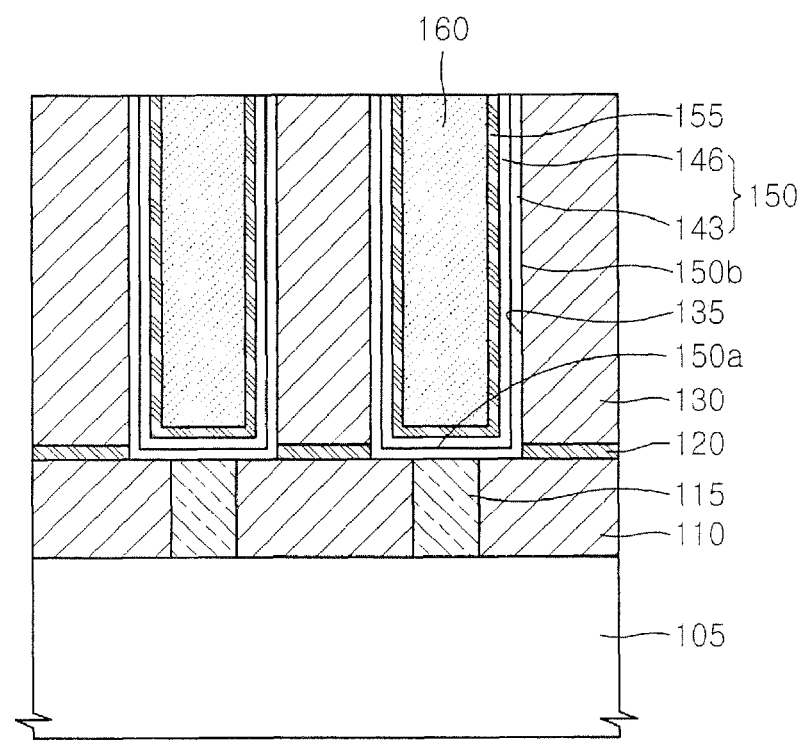

Referring to FIG. 7, the mask insulation layer (160' in FIG. 6), the protection layer (155' in FIG. 6), and the storage node electrode layer (150' in FIG. 6) on the mold insulation film 130 are removed to form a mask insulation film 160, a protection film 155, and a storage node electrode 150, respectively. The storage node electrode 150 includes a bottom 150a and a sidewall 150b inside the storage node electrode hole 135, and at least a portion of the bottom 150a is electrically connected to the contact plug 115. The protection film 155 is formed on an inner surface of the storage node electrode hole 135, and the mask insulation film 160 is formed on the protection film 155.

The mask insulation film 160 may serve as an etching mask that prevents the storage node electrode 150 and the protection film 155 inside the storage node electrode hole 135 from being etched in the above-described removing operation. For example, the removing operation may be performed using an etch-back process or a chemical mechanical polishing (CMP) process. Particularly, in the etch-back process, the mask insulation film 160 can prevent an etching gas from penetrating into the storage node electrode hole 135. In another embodiment in which the mask insulation film 160 is omitted, the removing operation may be performed using the CMP process.

Figure 8:
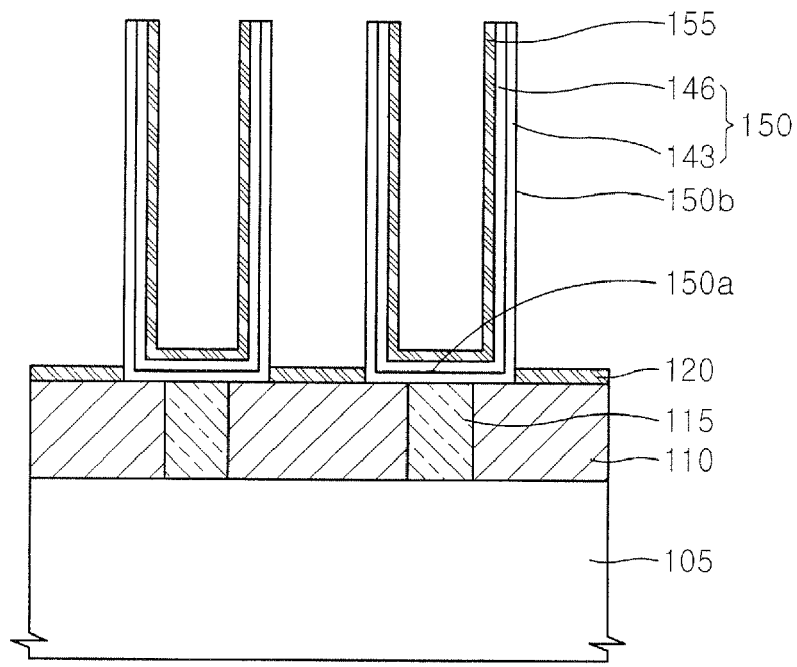

Referring to FIG. 8, the mask insulation film (160, in FIG. 7) and the mold insulation film (130 in FIG. 7) are removed using the protection film 155 as an etching mask. Accordingly, the inside of the storage node electrode 150 and the outside of the sidewall 150b can be exposed. The removing operation may be performed by a wet etch process using a wet chemical or etchant, for example, a diluted HF solution, a buffered oxide etchant (BOE), or a mixed solution of them. In the removing operation, the mask insulation film 160 in the storage node electrode 150 can be quickly removed because it has a smaller volume and a higher etching speed than the mold insulation film 130.

The protection film 155 may prevent wet chemicals from penetrating into the metal plug 115 and the interlayer insulation film 110 through the bottom 150a under the mask insulation film 160, which is quickly removed. Particularly, a columnar direction of the metal nitride film 146 of the bottom 150a, that is, a substantially vertical direction with respect to the semiconductor substrate 105, is susceptible to penetration of the wet chemical, but the protection film 155 can efficiently prevent the wet chemicals from penetrating because it does not have a columnar structure.

Next, in another embodiment, the storage node electrode 150 and the protection film 155 may be treated by an ashing process so that surfaces of the storage node electrode 150 and the protection film 155 can be oxidized. Accordingly, an exposed surface of the metal film 143 of the sidewall 150b may be oxidized, and a surface of the nitrided metal film of the protection film 155 may be oxidized. However, the protection film 155 substantially prevents oxidation of the metal nitride film 146, thereby substantially preventing resistance of the storage node electrode 150 from increasing. Also, a metal oxynitride film and/or a metal oxide film may be additionally formed on a surface of the nitrided metal film by an ashing process. For example, an ashing process may be performed using an oxygen gas for about 50-300 seconds.

Referring to FIG. 9, the dielectric film 165 is formed on the protection film 155 and the sidewall 150b, where the protection film 155 is not formed. For example, the dielectric film 165 may be formed as a single layer on the resultant substrate of FIG. 8. The dielectric film 165 may be formed using a conventional thin film deposition process, and include a silicon oxide film, a silicon nitride film, a metal oxide film with a high dielectric constant, or a stack film of these films. The plate electrode 170 is formed on the dielectric film 165. The plate electrode 170 may be formed using a conventional thin film deposition process.

Alternatively, the dielectric film 165 may be formed on the ashed protection film 155. In this case, the dielectric film 165 may have a high growth rate and a low surface roughness. This is because the dielectric film 165 successively grows on the metal oxide film of the protection film 155. An increase of the growth rate of the dielectric film 165 can enhance productivity, and the low surface roughness can enhance reliability.

Figure 10:
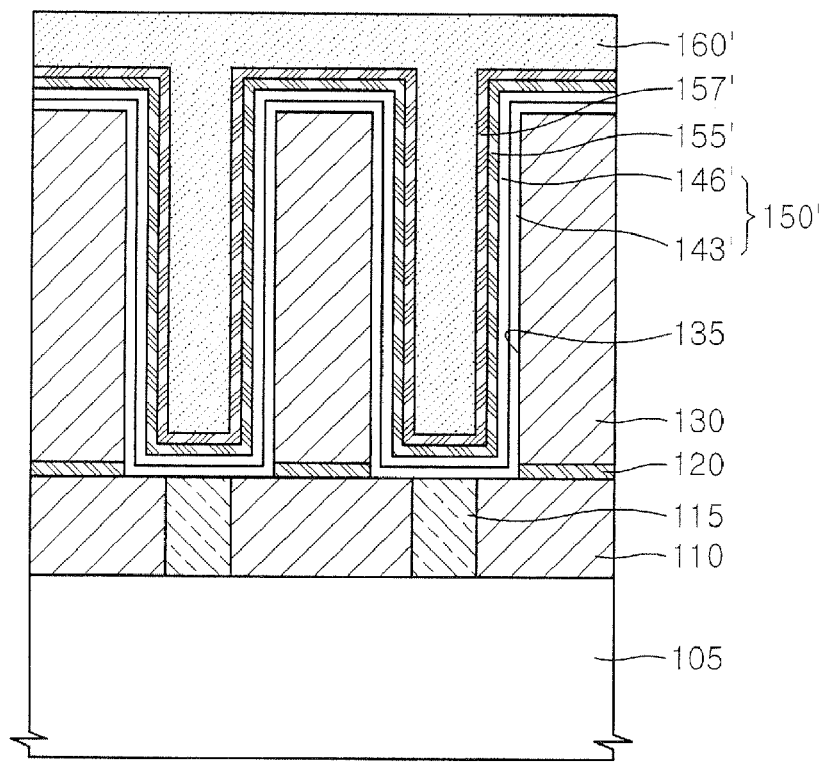
FIGS. 10 and 11 are cross-sectional views illustrating a semiconductor device and a method of fabricating the same according to another embodiment.
Figure 11:
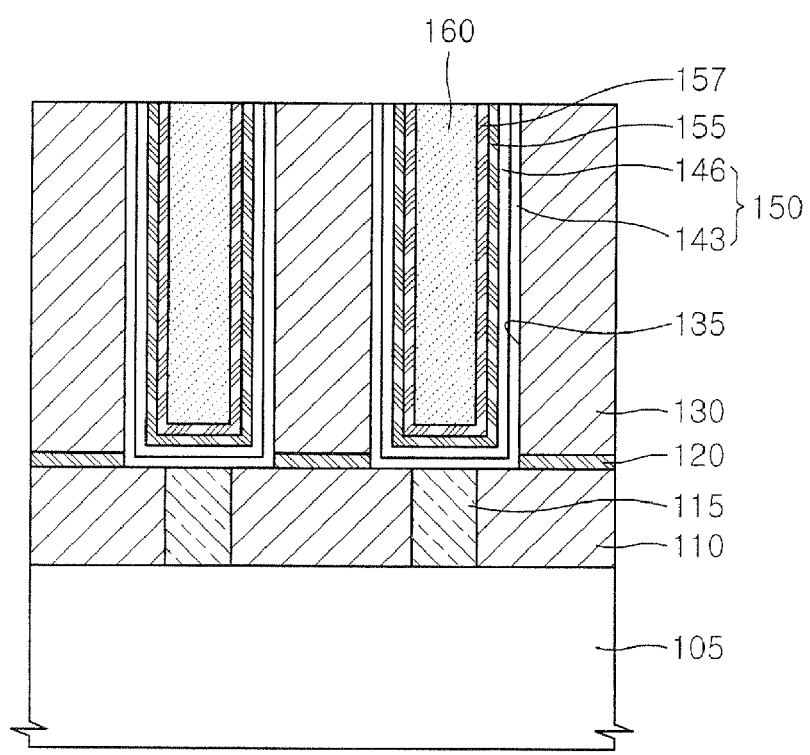

A method of fabricating a semiconductor device according to another embodiment will now be described with reference to FIGS. 10 and 11. The embodiment shown in FIGS. 10 and 11 may be a modification of the previous embodiment shown in FIGS. 2 through 9. Therefore, some processing steps shown in FIGS. 10 and 11 are the same or similar to the processing steps illustrated in the previous embodiment, and thus their descriptions will be omitted. The same reference numerals may denote the same or like elements in these embodiments. In this respect, the storage node electrode layer 150' and the protection layer 155' may be formed by processing steps illustrated in FIGS. 2 through 5.

Referring to FIG. 10, a capping layer 157' is formed on the protection layer 155'. For example, the capping layer 157' may include a silicon nitride film or a silicon oxynitride film. The capping layer 157' may be formed by a conventional thin film deposition process, for example, a CVD process. Next, the mask insulation layer 160' is formed on the capping layer 157'.

Referring to FIG. 11, the mask insulation layer (160' in FIG. 10), the capping layer (157' in FIG. 10), the protection layer (155' in FIG. 10), and the storage node electrode layer (150' in FIG. 10) on the mold insulation film 130 are removed to form the mask insulation film 160, a capping film 157, the protection film 155, and the storage node electrode 150, respectively. The removing operation was described with reference with FIG. 7.

Next, referring to FIG. 8 of the previous embodiment, the mold insulation film 130 and the mask insulation film 160 may be removed using the protection film 155 as an etching mask. The capping film 157 in FIG. 11 may be removed together with the mask insulation film 160 in the removing operation. The capping film 157 is etched at a very low speed in comparison with the mold insulation film 130 and the mask insulation film 160 including a silicon oxide film. Accordingly, the capping film 157 can delay a time when the protection film 155 is exposed to the wet chemical for removing the mask insulation film 160, so that it can help prevent the wet chemical from penetrating through the bottom 150a.

However, in another embodiment, an etching operation for removing the capping film 157 may be additionally performed. For example, a wet etching process using a phosphoric acid solution may be performed for removing the capping film 157.

Alternatively, an ashing process may be additionally performed on a surface of the exposed storage node electrode 150 and the protection film 155 to oxidize a surface of the storage node electrode 150 and the protection film 155. That is, an exposed surface of the metal film 143 of the sidewall 150b may be oxidized, and a surface of the nitrided metal film of the protection film 155 may also be oxidized. In addition, a metal oxynitride film and/or a metal oxide film may be formed on a surface of the nitrided metal film by the ashing process. For example, the ashing process may be performed using an oxygen gas for a short time period, for example, about 10-50 seconds.

Next, referring again to FIG. 9 of the previous embodiment, the dielectric film 165 and the plate electrode 170 may be formed.

Referring FIGS. 12 through 16, a method of fabricating a semiconductor device will be described according to another embodiment. The embodiment shown in FIGS. 12 through 16 may be a modification of the embodiment shown in FIGS. 2 through 9 and the embodiment shown in FIGS. 10 and 11. Therefore, some of the processing steps shown in FIGS. 12 through 16 and some of the processing steps shown in FIGS. 2 through 9 and FIGS. 10 and 11 are the same or similar, and thus their repeated descriptions will be omitted. The same reference numerals may denote the same or like elements in the embodiments.

The protection layer 155' and the capping layer 157' can be formed by processing steps described in connection with FIGS. 2 through 5 and FIG. 10.

Figure 12:
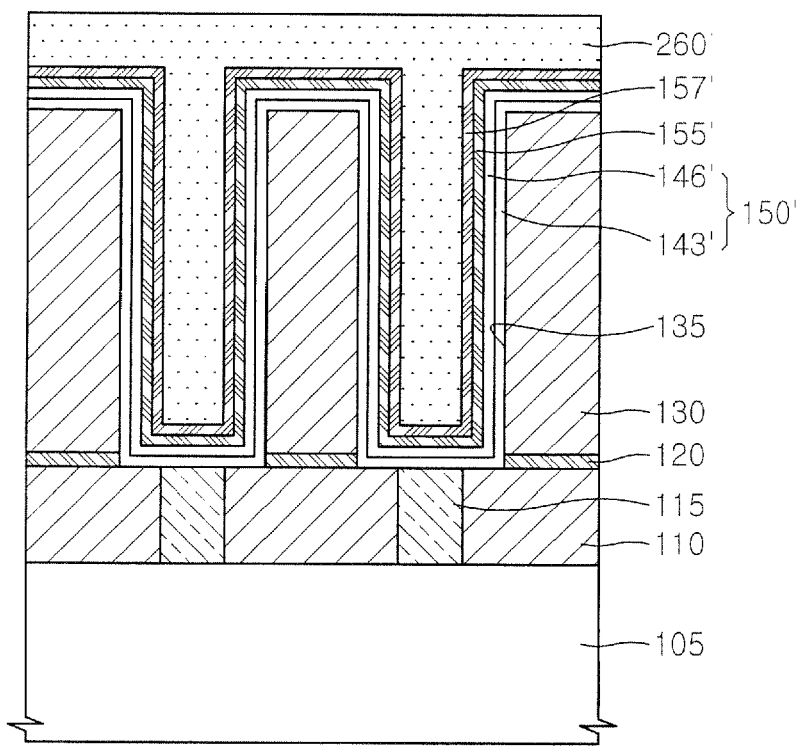
FIGS. 12 through 16 are cross-sectional views illustrating a semiconductor device and a method of fabricating the same according to another embodiment.

Referring to FIG. 12, a mask photoresist layer 260' is formed on the capping layer 157', for example, using a spin coating process.

Figure 13:
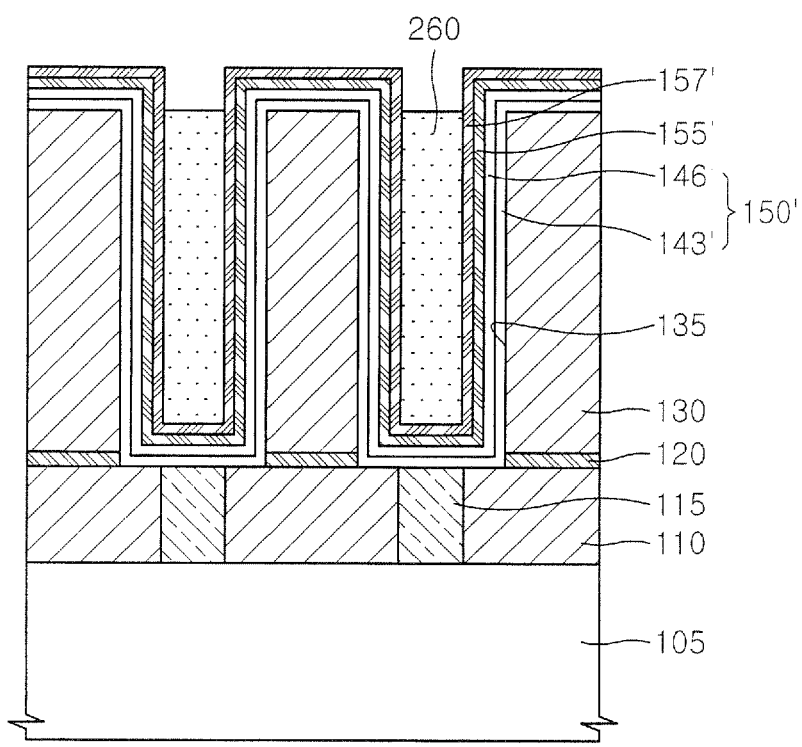

Referring to FIG. 13, the mask photoresist layer (260' in FIG. 12) is patterned to form a mask buffer film, e.g., a mask photoresist film 260. The mask buffer film may be formed using a material such as oxide within the spirit and scope of the invention. For example, the portion of the mask photoresist layer 260' disposed on the mold insulation film 130 is selectively exposed against the portion of the mask photoresist layer 260' in the storage node electrode hole 135 by controlling an exposure energy. Next, the exposed portion of the photoresist layer 260' is removed from the mold insulation film 130.

Figure 14:
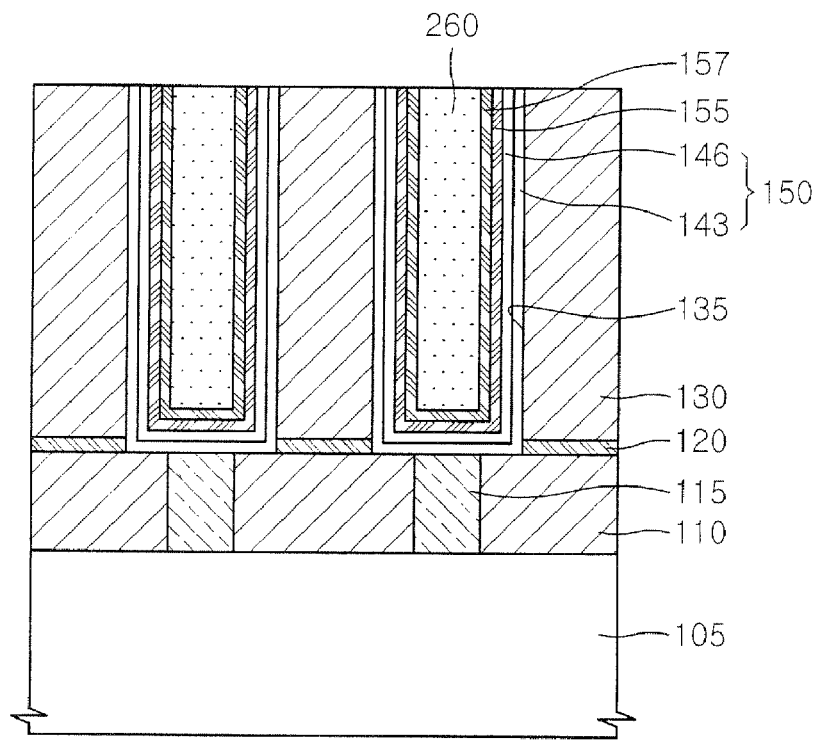

Referring to FIG. 14, the capping layer 157' in FIG. 13, the protection layer 155' in FIG. 13, and the storage node electrode layer 150' in FIG. 13, on the mold insulation film 130 are removed, using the mask photoresist film 260 as an etching mask, thereby forming a capping film 157, a protection film 155, and a storage node electrode 150, respectively. The removing operation can be understood from the description concerning FIG. 11.

Figure 15:
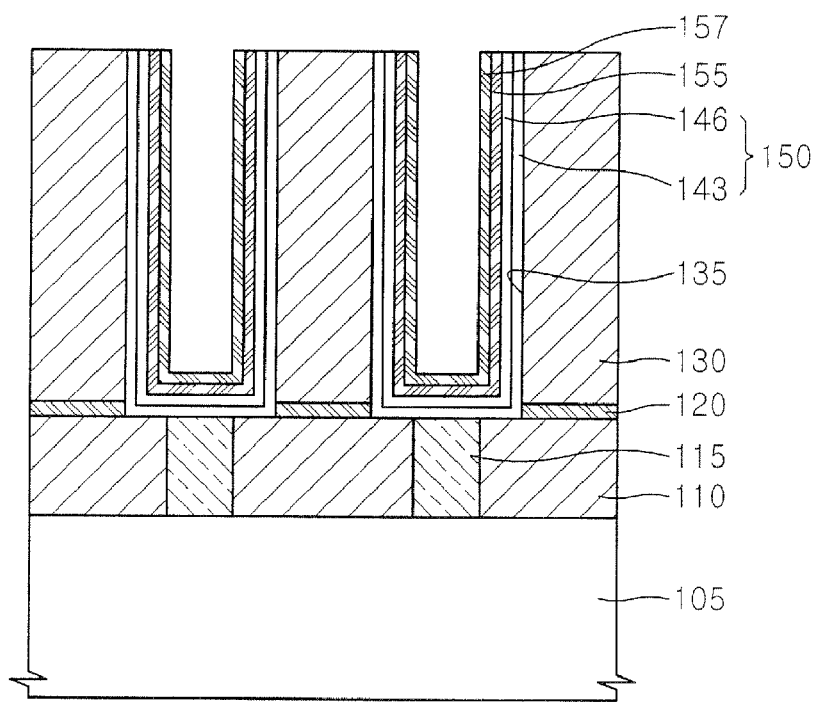

Referring to FIG. 15, the mask photoresist film 260 is removed. The removing operation may be performed using an ashing process. In this case, the storage node electrode 150 can be prevented from collapsing due to the ashing process because the mold insulation film 130 supports the storage node electrode 150.

Figure 16:
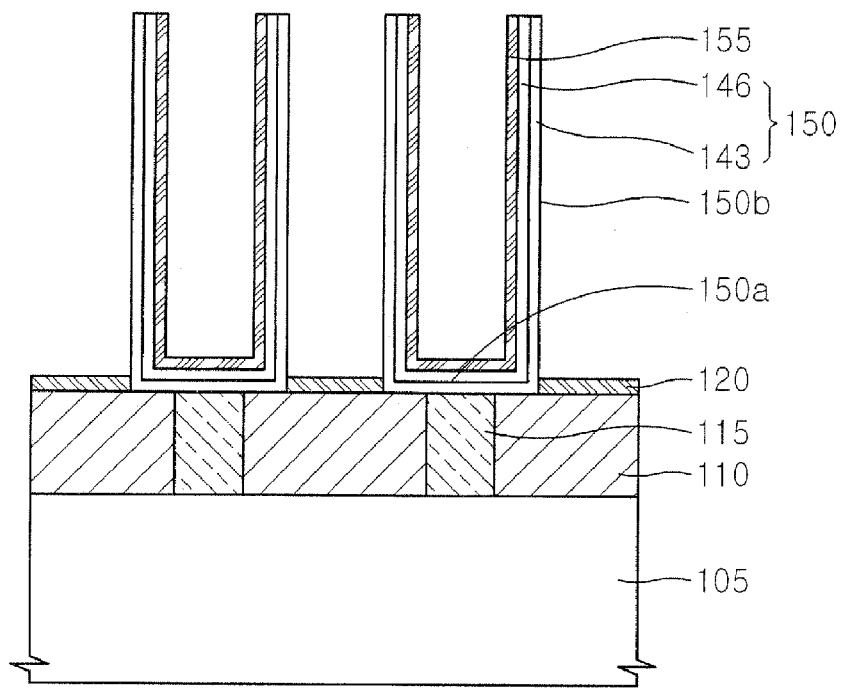

Referring to FIG. 16, the mold insulation film 130 is removed using the protection film 155 as an etching mask. The protection film 155 can prevent the wet chemical from penetrating through the bottom 150a. The removing operation can be understood from the description concerning FIG. 8. The capping film (157 in FIG. 15) can be removed together with the mask insulation film 160 in the removing operation. The capping film 157 is etched at a very low speed in comparison to the mold insulation film 130 and the mask insulation film 160 including a silicon oxide film. Accordingly, the capping film 157 can delay a time when the protection film 155 is exposed to the wet chemical for removing the mask insulation film 160, so that it can help prevent the wet chemical from penetrating through the bottom 150a.

However, in another embodiment, an etching operation for removing the capping film 157 may be further performed. For example, a wet etching using a phosphoric acid solution may be performed for removing the capping film 157.

In another embodiment, an ashing process may be performed on exposed surfaces of the storage node electrode 150 and the protection film 155 so that the surfaces of the storage node electrode 150 and the protection film 155 may be oxidized. That is, an exposed surface of the metal film 143 of the sidewall 150b may be oxidized, and a surface of the nitrided metal film of the protection film 155 may be oxidized. Also, a metal oxynitride film and/or a metal oxide film may be further formed on a surface of the nitrided metal film by the ashing process. For example, the ashing process may be performed using an oxygen gas for a short time period such as about 10-50 seconds.

Next, the dielectric film 165 and the plate electrode 170 may be formed as in the embodiment shown in FIG. 9.

Unlike the embodiment illustrated in FIG. 15 and FIG. 16, in another embodiment, the mold insulation film 130 may be first removed, and then the mask photoresist film 260 may be removed. That is, the mold insulation film 130 may be removed using the mask photoresist film 260 as an etching mask, and then the mask photoresist film 260 may be removed by ashing for about 100-500 seconds. In this case, the mask photoresist film 260 can prevent the wet chemical from penetrating into the storage node electrode 150. Accordingly, the capping film 157 may be omitted. Also, the protection film 150 may be ashed simultaneously in the ashing process for removing the mask photoresist film 260, and thus the additional ashing process may be omitted for ashing the protection film 150. That is, in the removing operation of the mask photoresist film 260, an effect of ashing the protection film 150 may be obtained, which is described in the above embodiments.

In another embodiment, the capping layer 157' and the capping film 157 may be omitted. When the capping layer 157' and the capping film 157 are omitted, the embodiment can be understood from the description concerning FIGS. 2 through 9.

Experimental Results

Figure 17:
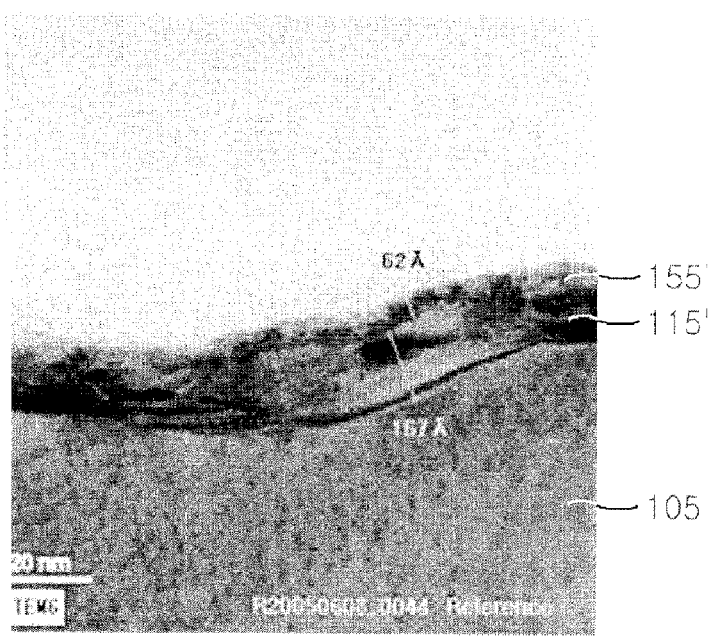
FIG. 17 is a transmission electron microscope photograph showing a tolerance of a nitrided metal layer to a wet chemical, when the nitrided metal layer is used as a protection film in many embodiments.

FIG. 17 is a transmission electron microscope (TEM) photograph showing a tolerance of a nitrided metal layer to a wet chemical when the nitrided metal layer is used as a protection layer in the embodiments described above. A portion of a metal plug layer, for example, a metal silicide layer 115' is formed on the semiconductor substrate 105, and the protection layer, that is, a nitrided titanium layer 155', is formed on the metal silicide layer 115'. Next, the semiconductor substrate where the nitrided titanium layer 155' is formed is maintained in a wet chemical for removing an oxide film, for example, a solution containing HF for a predetermined time. The HF-containing solution may be used for removing the mold insulation film (130 in FIG. 7) and the mask insulation film (160 in FIG. 7).

As illustrated in FIG. 17, the nitrided titanium layer 155' is almost not etched by the HF-containing solution, and the HF-containing solution does not penetrate through the nitrided titanium layer 155'. Accordingly, the metal silicide layer 115' under the nitrided titanium layer 155' is not etched at all, so that a void is not generated.

Figure 18:
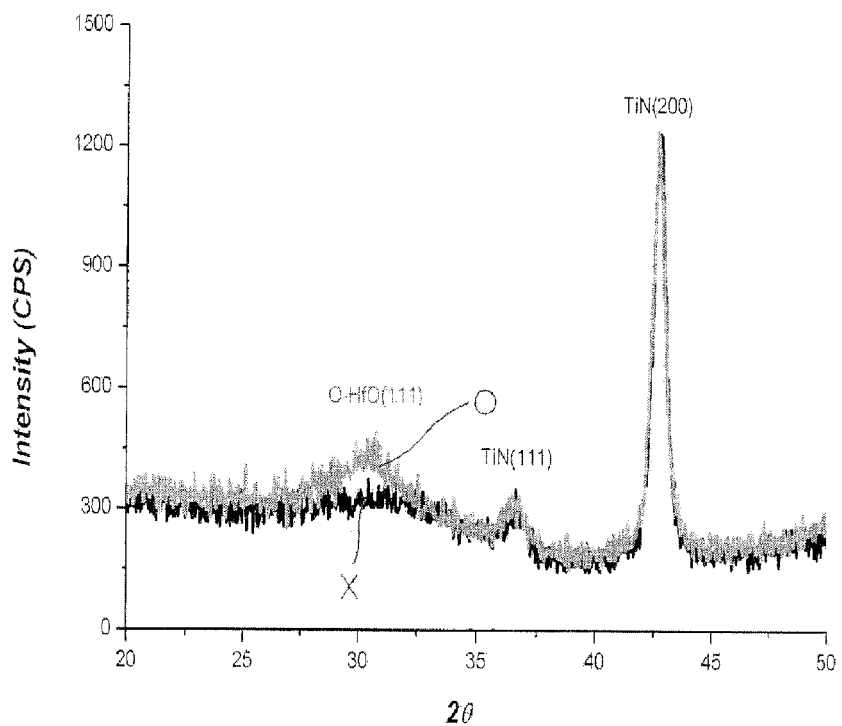
FIG. 18 is a graph showing an analysis result of X-ray diffraction (XRD), the analysis result showing an effect of ashing of a protection film on the crystallinity of a dielectric film and a plate electrode.

FIG. 18 is a graph showing X-ray diffraction (XRD) analysis results. The analysis results show the effects of ashing (on a protection film) on the crystallinity of the dielectric film and the plate electrode. A hafnium oxide ($HfO_2$) film is used as the dielectric film, and a titanium nitride (TiN) film is used as the plate electrode on the dielectric film. In FIG. 18, a portion represented by "X" means an XRD result of an $HfO_2$ film and a TiN film on the protection film which is not ashed, and a portion represented by "O" means an XRD result of an $HfO_2$ film and a TiN film on the protection film which is ashed.

Referring to FIG. 18, there is nearly no difference in the crystallinity of the titanium nitride film regardless of whether the protection film is ashed or not. However, the crystallinity was almost not observed in the case (X) of the $HfO_2$ film on the protection film which was not ashed, while a small (111) crystal peak was observed in the case (O) of the $HfO_2$ film on the protection film which was ashed.

Figure 19:
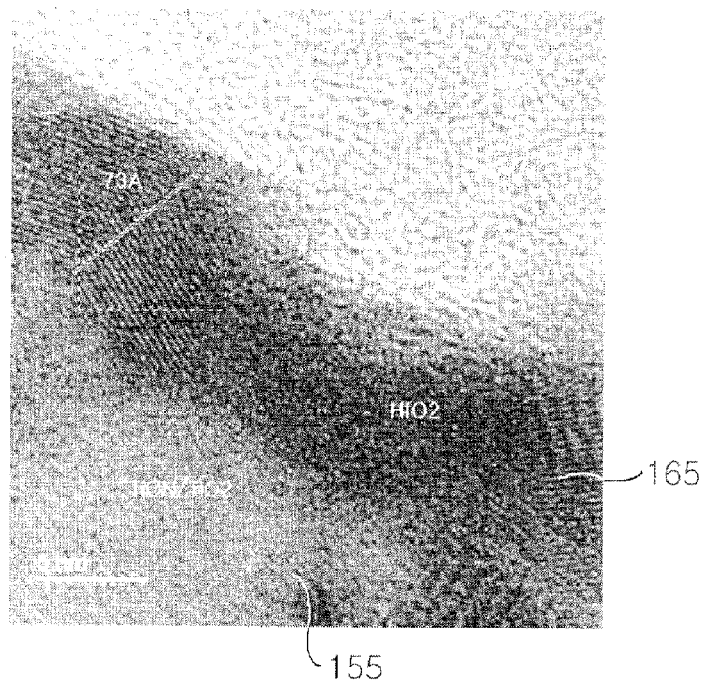
FIG. 19 is a transmission electron microscope photograph showing a section of a dielectric film on an ashed protection film.

The above result can be observed from a transmission electron microscope (TEM) photograph showing the $HfO_2$ film on the protection film which is ashed as illustrated in FIG. 19. Referring to FIG. 19, the $HfO_2$ film 165 with a fine grain structure is observed on the protection film 155 including the nitrided metal film, the metal oxynitride film, and the metal oxide film. The crystallinity can be helpful to improve the quality of the $HfO_2$ film. Also, from the result, it is seen that the metal oxide film which is formed on a surface of the protection film 155 by the ashing process affects the growth of grains in the $HfO_2$ film.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
    an interlayer insulation film formed on a semiconductor substrate, the interlayer insulation film including a contact plug;

a storage node electrode electrically connected to the contact plug, wherein the storage node electrode comprises a metal nitride film;

a protection film formed on the storage node electrode, the protection film including a nitrided metal film, wherein the nitrided metal film has a higher density than the metal nitride film;

a dielectric film formed on the protection film; and a plate electrode formed on the dielectric film.

2. The semiconductor device of claim 1, wherein the nitrided metal film of the protection film is on an inner surface of the storage node.

3. The semiconductor device of claim 1, wherein the storage node electrode comprises a stack film including a metal film and the metal nitride film.

4. The semiconductor device of claim 1, wherein the metal nitride film comprises TiN, TaN or WN.

5. The semiconductor device of claim 1, wherein a grain structure of the metal nitride film is columnar and a grain structure of the nitrided metal film is less columnar than the grain structure of the metal nitride film.

6. The semiconductor device of claim 1, wherein the storage node electrode comprises a stack film including another nitrided metal film and a metal nitride film.

7. The semiconductor device of claim 1, further comprising a metal oxynitride film or a metal oxide film or a stack film of the metal oxynitride film and the metal oxide film on the nitrided metal film.

8. The semiconductor device of claim 1, wherein the dielectric film overlies the nitrided metal film and the plate electrode overlies the dielectric film.

9. The semiconductor device of claim 1, wherein the dielectric film overlies a sidewall of the storage node electrode.

10. A semiconductor device comprising:

a storage node electrode electrically connected to a substrate, the storage node electrode comprising a material having a columnar grain structure, wherein the storage node electrode comprises a metal nitride film;

a protection film on the storage node electrode, the protection film having a grain structure that is less columnar than the grain structure of the storage node electrode, wherein the protection film comprises a nitrided metal film and wherein the nitrided metal film has a higher density than the metal nitride film;

a dielectric film on the protection film; and a plate electrode on the dielectric film.

11. The semiconductor device of claim 10, wherein the protection film is on an inner surface of the storage node electrode.

12. The semiconductor device of claim 10, wherein the storage node electrode comprises a stack film including a metal film and the metal nitride film.

13. The semiconductor device of claim 10, wherein the metal nitride film comprises TiN, TaN or WN.

14. The semiconductor device of claim 10, wherein the protection film further comprises a metal oxynitride film or a metal oxide film or a stack film of the metal oxynitride film and the metal oxide film on the nitrided metal film.

15. The semiconductor device of claim 10, wherein the protection film comprises a material having a random grain structure.

16. The semiconductor device of claim 10, wherein the dielectric film overlies the protection film and the plate electrode overlies the dielectric film.

17. The semiconductor device of claim 10, wherein the dielectric film contacts a sidewall of the storage node electrode.

18. A method of fabricating a semiconductor device, the method comprising:

forming a mold insulation film on an interlayer insulation film having a contact plug, the mold insulation film including a storage node electrode hole exposing at least a portion of the contact plug;

forming a storage node electrode in the storage node electrode hole, the storage node electrode electrically connected to the contact plug;

forming a protection film including a nitrided metal film on the storage node electrode comprising forming a metal layer on the storage node electrode, nitriding the metal layer, and removing a portion of the nitride metal layer on the mold insulation film;

removing the mold insulation film to expose a sidewall of the storage node electrode;

forming a dielectric film on the protection film and on the sidewall of the storage node electrode; and forming a plate electrode on the dielectric film.

19. The method of claim 18, wherein forming the storage node electrode comprises:

forming a storage node electrode layer on the mold insulation film and within the storage node electrode hole; and removing a portion of the storage node electrode layer on the mold insulation film.

20. The method of claim 18, further comprising:

forming a capping layer on the protection film, the capping layer being insulative;

removing a portion of the capping layer on the mold insulation film to form a capping film; and removing the capping film after removing the mold insulation film.

21. The method of claim 20, wherein the capping film comprises a nitride film or an oxynitride film.

22. A method of fabricating a semiconductor device, the method comprising:

forming a mold insulation film on an interlayer insulation film having a contact plug, the mold insulation film including a storage node electrode hole exposing at least a portion of the contact plug;

forming a storage node electrode in the storage node electrode hole, the storage node electrode electrically connected to the contact plug;

forming a protection film including a nitrided metal film on the storage node electrode;

removing the mold insulation film to expose a sidewall of the storage node electrode;

forming a dielectric film on the protection film and on the sidewall of the storage node electrode;

forming a plate electrode on the dielectric film;

forming a mask buffer film on the protection film before removing the mold insulation film; and removing the mask buffer film to expose the protection film before forming the dielectric film.

23. The method of claim 22, wherein the mask buffer film and the mold insulation film comprise oxide.

24. The method of claim 22, wherein the mold insulation film comprises an oxide film and the mask buffer film comprises a photoresist film.

25. The method of claim 24, wherein forming the mask buffer film comprises:

forming a photoresist layer on the protection film and the mold insulation film;

selectively exposing the photoresist layer on the mold insulation film with respect to the photoresist layer in the storage node electrode hole; and removing the exposed portion of the photoresist layer from the mold insulation film.

26. The method of claim 25, wherein forming the protection film comprises:

forming a protection layer on the storage node electrode layer before forming the mask buffer film; and selectively removing a portion of the protection layer on the mold insulation film using the mask buffer film as an etching mask.

27. The method of claim 22, further comprising removing the mask buffer film while removing the mold insulation film.

28. The method of claim 22, further comprising removing the mask buffer film after removing the mold insulation film.

29. The method of claim 22, further comprising removing the mold insulation film after removing the mask buffer film.

30. The method of claim 22, further comprising oxidizing surfaces of the storage node electrode and the protection film after removing the mask buffer film.

31. The method of claim 22, further comprising oxidizing surfaces of the storage node electrode and the protection film during removal of the mask buffer film.

32. The method of claim 18, wherein the storage node electrode comprises a metal nitride film.

33. A method of fabricating a semiconductor device, the method comprising:

forming a storage node electrode electrically connected to a semiconductor substrate, the storage node electrode comprising a material having a columnar grain structure;

forming a protection film including a nitrided metal film on the storage node electrode, the protection film including a material that is the same as a material of the storage node electrode and has a grain structure that is less columnar than the grain structure of the storage node electrode;

removing the mold insulation film to expose a sidewall of the storage node electrode; forming a dielectric film on the protection film and on the sidewall of the storage node electrode; and forming a plate electrode on the dielectric film.

* * * * *